(12) United States Patent
Gamper et al.

(10) Patent No.: US 7,965,764 B2
(45) Date of Patent: *Jun. 21, 2011

(54) SIMULTANEOUS PHYSICAL AND PROTOCOL LAYER ANALYSIS

(75) Inventors: Roland Gamper, Meyrin (CH); Kenneth William Johnson, Brewster, NY (US); Gilles Ritter, Ollon (CH); Lawrence Steven Salant, New Hempstead, NY (US)

(73) Assignee: Lecroy Corporation, Chestnut Ridge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/704,569

(22) Filed: Feb. 12, 2010

(65) Prior Publication Data

US 2010/0141657 A1 Jun. 10, 2010

Related U.S. Application Data

(63) Continuation of application No. 12/143,508, filed on Jun. 20, 2008, now Pat. No. 7,756,199, which is a continuation of application No. 10/836,385, filed on Apr. 30, 2004, now Pat. No. 7,403,560.

(60) Provisional application No. 60/542,985, filed on Feb. 9, 2004.

(51) Int. Cl.
*H04B 3/46* (2006.01)

(52) U.S. Cl. ..................................................... 375/228

(58) Field of Classification Search .................. 375/228; 708/66–68
See application file for complete search history.

(56) References Cited

U.S. PATENT DOCUMENTS

| 4,094,310 A | 6/1978 | McEachem et al. |
| 4,109,243 A | 8/1978 | Day et al. |
| 4,139,903 A | 2/1979 | Morrill, Jr. et al. |
| 4,774,498 A | 9/1988 | Traa |
| 4,991,581 A | 2/1991 | Andries |
| 5,039,937 A | 8/1991 | Mandt et al. |
| 5,107,377 A | 4/1992 | Ballard |
| 5,214,784 A | 5/1993 | Ward et al. |
| 5,446,650 A | 8/1995 | Overhage et al. |
| 5,517,105 A | 5/1996 | Holzwarth |

(Continued)

FOREIGN PATENT DOCUMENTS

JP 2000 088612 3/2000

OTHER PUBLICATIONS

"New Oscilloscopes Target Cost-Sensitive Customers in Performance-driven Applications" Tektronix, www.tek.com, Jan. 6, 2005.

(Continued)

*Primary Examiner* — Don N Vo
(74) *Attorney, Agent, or Firm* — Frommer Lawrence & Haug LLP; William S. Frommer

(57) ABSTRACT

A method and apparatus for capturing an analog waveform on a serial bus. The method comprises the steps of designating a predetermined digital data sequence, decoding a serial data signal carried on a serial data bus, and comparing the decoded serial data signal to the predetermined digital data sequence. When it is determined that a portion of the decoded serial data matches the predetermined digital data sequence, the portion of the serial data signal corresponding to the matching portion of the decoded serial data signal is marked.

13 Claims, 14 Drawing Sheets

U.S. PATENT DOCUMENTS

| | | | |
|---|---|---|---|
| 5,854,996 | A | 12/1998 | Overhage et al. |
| 5,877,620 | A | 3/1999 | Tomi |
| 5,923,161 | A | 7/1999 | Frankovitch et al. |
| 6,002,104 | A | 12/1999 | Hsu |
| 6,038,262 | A * | 3/2000 | Ganter .......... 375/296 |
| 6,195,617 | B1 | 2/2001 | Miller |
| 6,311,138 | B2 | 10/2001 | Miller |
| 6,327,544 | B1 | 12/2001 | Samuels |
| 6,442,730 | B1 | 8/2002 | Schachner et al. |
| 6,518,744 | B1 | 2/2003 | Tallman et al. |
| 6,525,525 | B1 | 2/2003 | Azinger |
| 6,556,202 | B1 | 4/2003 | Taraki et al. |
| 6,570,592 | B1 | 5/2003 | Sajdak et al. |
| 6,639,607 | B1 | 10/2003 | Ferguson et al. |
| 6,690,398 | B1 | 2/2004 | Beck et al. |
| 6,707,474 | B1 | 3/2004 | Beck et al. |
| 6,795,515 | B1 | 9/2004 | Riedle et al. |
| 6,847,349 | B2 | 1/2005 | Azinger |
| 6,850,852 | B1 | 2/2005 | Ferguson et al. |
| 7,224,363 | B2 | 5/2007 | Kamiyama |
| 7,756,199 | B2 * | 7/2010 | Gamper et al. ......... 375/228 |
| 2001/0046222 | A1 | 11/2001 | Hoshiko |
| 2003/0095099 | A1 | 5/2003 | Azinger |
| 2003/0220753 | A1 | 11/2003 | Pickerd et al. |
| 2005/0038615 | A1 | 2/2005 | Kobalka et al. |

OTHER PUBLICATIONS

"Signal Integrity: Faster and Simpler Debugging with Integrated Digital Analog Measurement", Tektronix, www.tek.com, Sep. 20, 2002.

* cited by examiner

SIMULTANEOUS PHYSICAL AND PROTOCOL LAYER ANALYSIS

CROSS REFERENCE TO RELATED APPLICATIONS

This is a continuation of application Ser. No. 12/143,508, filed Jun. 20, 2008, now U.S. Pat. No. 7,756,199, which is a continuation of application Ser. No. 10/836,385, filed Apr. 30, 2004, now U.S. Pat. No. 7,403,560, granted Jul. 22, 2008, which is entitled to the priority filing date of application Ser. No. 60/542,985 filed Feb. 9, 2004, the entirety of which is incorporated herein by reference.

BACKGROUND OF THE INVENTION

The present invention relates generally to the simultaneous interpretation and display of both a digital data stream and its underlying analog transmission signal. Such a simultaneous interpretation allows for the analyzing of any particular portion of the digital data, such as an error, and the underlying analog signal giving rise to the particular data, or error.

Data communications is the transmission of messages from one electronic device to other electronic devices. These messages are transmitted through a communications channel. A physical wire, optical cable, radio or other appropriate transmission medium may be used to implement the communications channel. A stream of individual data bits represents each message, thus comprising a digital data message. A communications protocol is an agreed-upon convention that defines the order and meaning of bits in a serial digital data stream. It may also specify a procedure for exchanging messages. A protocol will define how many data bits compose a message unit, the framing and formatting bits, error detection/correction bits, and any other information needed to transmit the message from the source to its destination, and to allow confirmation that the proper message was received on the receiving end.

When designing and building devices that communicate with each other to transmit messages therebetween, the builders must be aware that problems can occur during the transmission of the data, a device may incorrectly interpret a message, or a device may improperly respond to a received message. Tools are presently available for an individual to look at either the physical layer (comprising the actual received analog data signal) or the protocol layer (comprising the decoded digital data) separately. Protocol analyzers, for example, capture, decode, interpret, and react to the contents of data packets as they transit a network's media. They are typically concerned with layers 2 (Data Link) through 5 (Session) of the industry standard ISO/OSI Reference Model. However, they are blind to the shape and timing of the signals or Layer 1 (hardware, connections, etc). On the other hand, oscilloscopes and serial data analyzers allow the operator to accurately capture the data bits and view their shape as well as measure eye patterns, jitter, bit errors and other signal parameters such as rise time and overshoot for a wide variety of serial data standards which allow the operator to analyze the Layer 1, but do nothing for higher levels of the protocol stack. While some oscilloscopes now allow for a user to trigger on a specific serial analog data pattern so that a user can detect a predefined sequence of information, there has traditionally been no information provided above this physical layer as to the information content of the serial digital data stream represented by the captured analog waveform.

Attempts at providing correlated analog and digital data have been less than satisfactory. In one approach a serial data signal is displayed, and a cursor may define a portion of the serial data signal to be decoded to digital data in accordance with a predefined protocol. While this allows for the viewing of serial and same correlated digital data, this system has significant drawbacks. For example, the inventors of the present invention have determined that because there is no provision for triggering on a misinterpreted waveform, for example, it is not possible to monitor the digital data for an error in accordance with the defined protocol, and then view the portion of the analog signal corresponding to the digital error.

SUMMARY OF THE INVENTION

In accordance with the invention, the inventors have therefore determined that sometimes it is necessary to see the relationship between these physical and protocol layers. For example, one might want to determine the cause of an invalid or corrupt message. Thus, if an error is detected in the digital data, one might want to analyze the underlying analog signal used to transmit the digital data.

Another use is that an individual may wish to understand the timing between a serial data signal and other analog signals in a system. Presently, in order to verify a timing between various digital serial data signals and analog signals, the analog signal is physically displayed on a DSO (Digital Sampling Oscilloscope) and is often crudely interpreted by counting bits (to then manually decode into a text message to interpret the destination or message) as is shown in FIG. 1, or interpreted in a separate protocol analyzer that displays message (protocol) information as is shown in FIG. 2. As the inventors of the present invention have determined, there is no single test device with the required bandwidth and number of channels that can trigger on serial data signals, measure the physical layer properties, and interpret the data layer information.

In addition, in accordance with the invention, because the apparatus interprets data at the protocol layer and then allows for analyzing the underlying analog signals, a user need not view an entire analog data stream to determine a particular portion of interest. Instead, a user may set one or more criteria in the digital data signal. Upon meeting one or more of these criteria, a specific serial data signal can be triggered upon, and portions of the analog signal that generated the digital data that met the criteria can be reviewed. This technique is particularly useful when reviewing long, non-repetitive data streams for an error, or for some other uncommon trigger criteria. Rather than crudely counting bits in the analog signal, as noted above, the portion of the analog signal is displayed when it is determined that the corresponding digital data meets one or more predetermined criteria, thus saving a user tremendous amounts of time. Thus, the decoded digital data itself may be used to define the trigger location for obtaining the corresponding analog serial data stream.

Moreover, because the criteria are set in one or more of the protocol layers, a user may set the criteria corresponding to any of the protocol layers. Thus, for example, if a user were using the present invention to monitor the status of an automobile, a user would be able to request a data trigger when a criteria, such as engine_idle_speed<=800 rpm. Thus, a user may set a data trigger criteria in a way that he can understand (i.e. not necessarily binary or hexadecimal format) and with various conditions applied.

In this manner, a user is easily able to set and define criteria, and quickly view analog signal data corresponding to digital data meeting the predefined criteria.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

In accordance with the present invention, a physical layer serial data stream is first captured by a digital oscilloscope (such as a LeCroy® X-Stream based digital oscilloscope). The captured data stream is then is analyzed by a protocol specific waveform decoder to create combined physical layer and data layer view for more complete interpretation of data and easy debugging of bus, communication, and other possible problems. The waveform decoder translates the captured data stream of the physical layer in to a sequence of bits (1's and 0's) and groups the bits into the various parts of the message as defined by the specified protocol. The data bits can be viewed simultaneously with the original captured signal.

Figure 1:
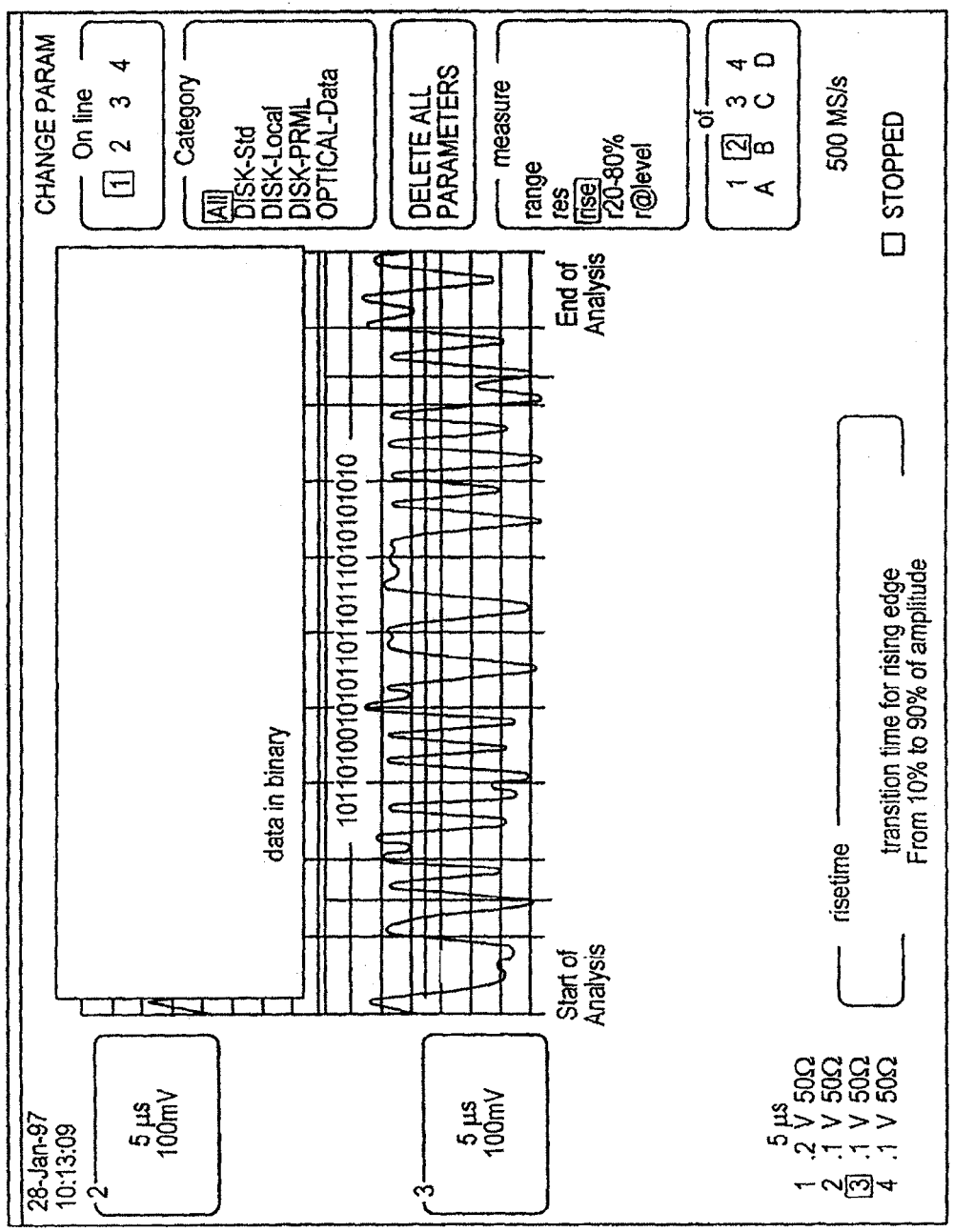
FIG. 1 is a screen shot of an oscilloscope used by an operator to count bits of an analog data signal and display associated digital data.
Figure 2:
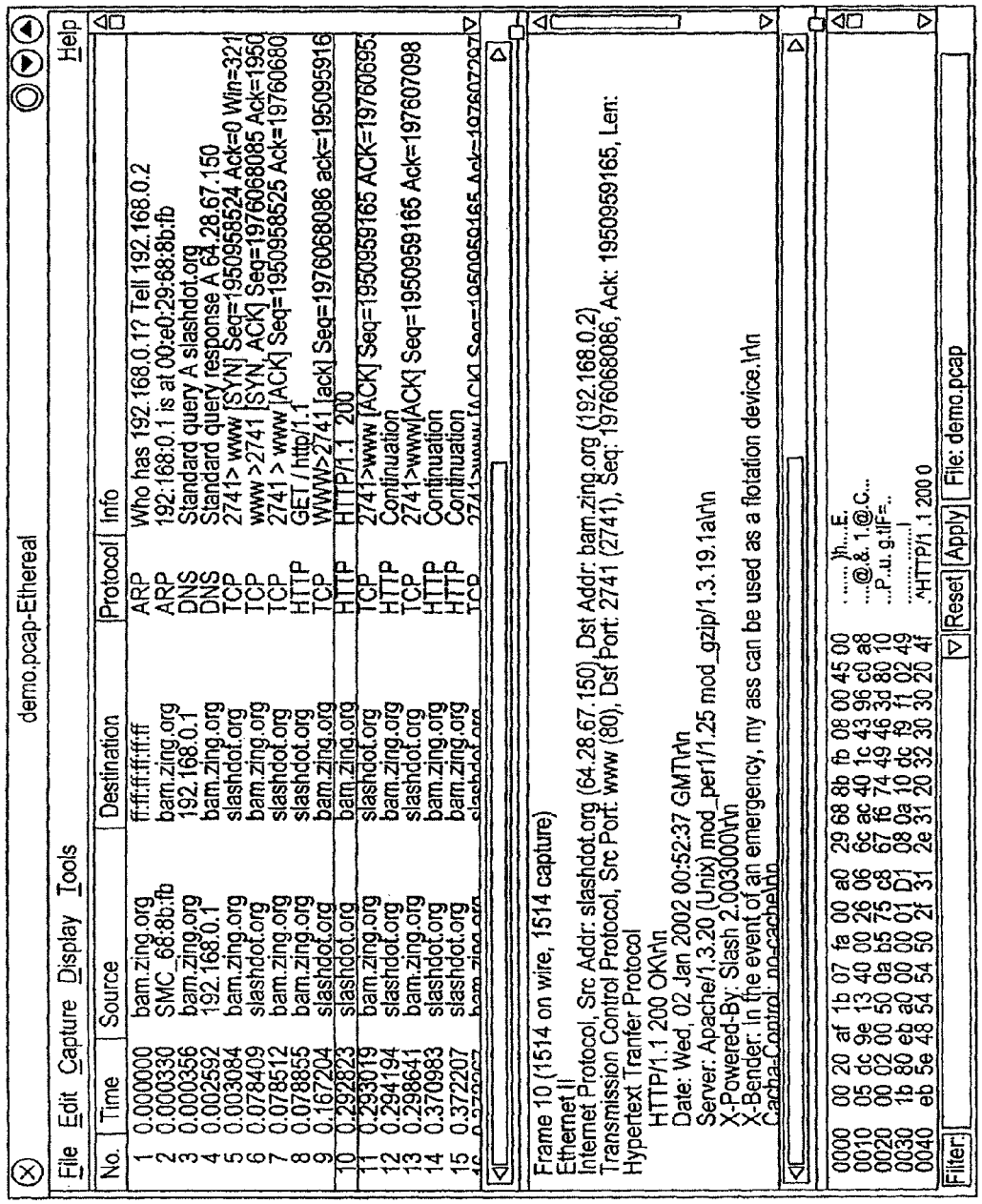
FIG. 2 is a screen shot of an output from a protocol analyzer.
Figure 3:
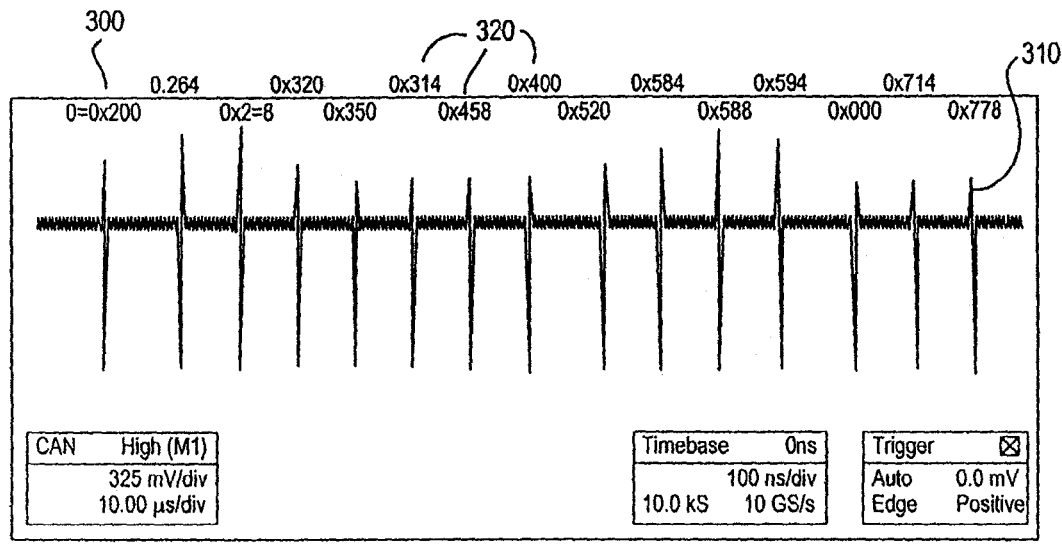
FIG. 3 is a screen shot depicting multiple messages captured in a single acquisition, and a decoded ID field shown for each message in accordance with the invention.

As is shown in FIG. 3, a screen shot depicting an acquired and decoded data stream 310 is shown of a display 300. Multiple messages may be captured in a single acquisition. Each message may include a separate ID field. Decoded data from these ID fields is shown in FIG. 3 at 320. Thus all of the data signal information for each message is depicted bunched up corresponding to each noted ID information 320. For example, physical layer data stream information corresponding to a message located at ID 0x4bc is shown on display 300 bunched below a corresponding ID label.

Figure 4:
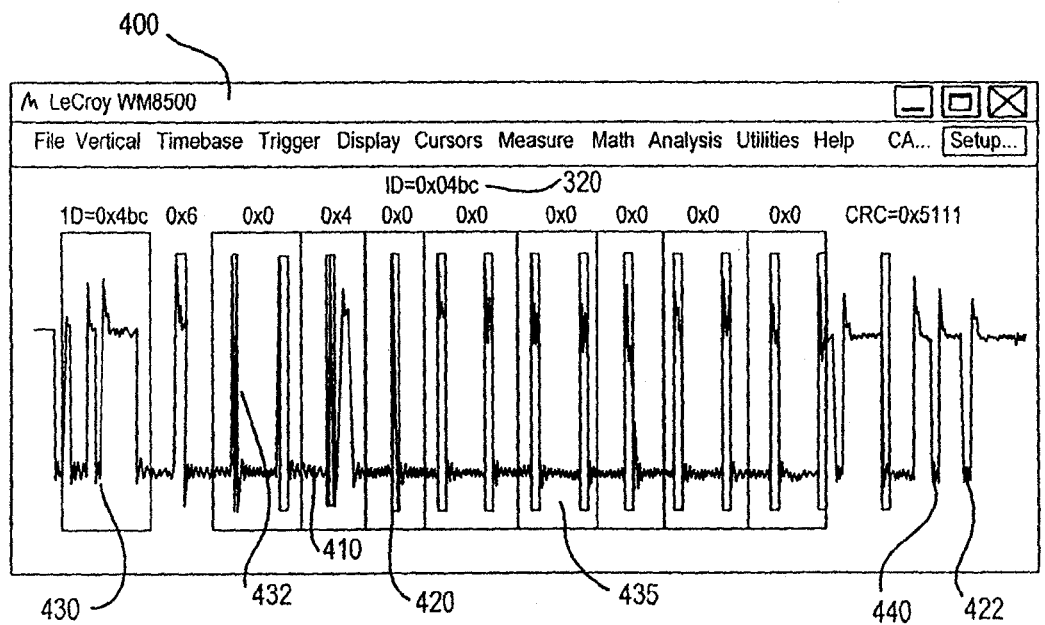
FIG. 4 is a screen shot depicting decoded data (from a single message) viewed simultaneously with the original captured analog signal.

Once data for the various messages has been acquired, separated out and decoded according to the applicable protocol, decoded data (from a single message) can be viewed, along with the original captured signal. Referring next to FIG. 4, a screen shot depicting such data corresponding to a single message is shown. A display 400 displays decoded data and original captured signal corresponding to ID 0x4bc, noted above. Shown in display 400 is a portion 410 of the original captured signal 310 corresponding to a selected message ID (in this case ID 0x4bc), as well as stuff bits 420 inserted into the data signal 410. According to the protocol employed for decoding the data stream, different parts of the message are identified and differentiated, for example highlighted in different colors. Of course, any other appropriate methods of delineating the portions of the decoded message may be employed. As shown in FIG. 4, the decoded message is divided into an ID field 430, a data length control (DLC) field 432, a data field 435, a CRC checksum field 440, and an acknowledge field 442. While not shown, one embodiment displays the bit rate associated with each of the data messages. Bit rate of a signal is an important measurement, and is used in many analysis tools. Being shown the bit rate would allow a visual confirmation, and therefore notice of any deviation, from an intended bit rate.

In addition to being able to view a single message displayed on the screen, a user may filter the messages based upon message ID, and/or any data sequences within the signal. A data sequence will contain many messages. While paging through a sequence of data structures, stopping each time on a message having the desired ID is possible, it is far more convenient for a user to view all messages that have a particular ID, corresponding to a particular system event. In this way, the messages would be displayed adjacent each other, if desired, or shown in context of the data signal. The user could additionally, request that all messages including a particular sequence of data be shown. Finally, upon filtering, instead of scrolling through each of the designated messages, a table could be displayed, indicating each portion of the signal that meets the filter criteria, and an indication of the locating thereof in the signal (i.e. bit offset, time offset, etc.).

Traditionally, to determine whether a signal had reached a predetermined threshold, and was therefore considered a "1" or a "0", the signal was looked at to determine whether it had crossed the threshold during the bit period. However, this results in a bias against the prior value. Thus, if a value starts below a threshold, a single spike above the threshold would result in a determination that the bit value had changed. This would be true, even if for most of the bit period the value was below the threshold, and the spike was a result of noise. This would result in an error. Therefore in accordance with the invention the value of the signal during the entire bit period is averaged. In such a manner, a single spike from noise would not result in an incorrect determination of the value at the bit period. While on display 400, the averaging of the value during the bit period would avoid an error, a user could still view the signal associated with the bit period to see whether the shape of the waveform gives any clue as to why the signal spiked across the threshold.

Furthermore, analysis of the data stream in other ways is also possible. For example, once an average of each of the bit values has been determined, these values can be grouped as selected by a user, either in accordance with a parameter defined by a protocol, or any other desired bit sequence, to for a measurable value, which can then be graphed to show any drift in the value, or other patterns that might arise as a result of some systematic changes in the system. More information is available about the system, and can be viewed by a user as a trend graph, histogram, or results of a statistical analysis, perhaps to account for various changes in the signal. In any event, the accumulation of this data can be used in any number of ways, as desired by the user and implemented on a digital oscilloscope, to generate additional information regarding the consistency and/or integrity of the acquired signal.

According to the protocol employed, or in accordance with another interpretation database, symbolic names that correspond to the data bits in the header and data parts of the message may be applied to the decoded data. Thus, after decoding a particular bit sequence (preferably in accordance with the averaging scheme noted above), that bit sequence can be interpreted by any interpretation scheme that was applied during coding to determine a message that was encoded into the data. In this manner, the oscilloscope can use such a database or other interpretation scheme to translate the data bits into corresponding symbolic names and display them simultaneously with the original waveform. The database can be as simple as in the case of RS232 where it would contain the ASCII code to map to each byte, or it can be complex to have different mapping for each field or sub field within the message. As noted above, a user could filter the symbolic results to view all messages in a data signal corresponding to a particular symbolic name. These results could also be shown in a table, as noted above.

While this invention is applicable to any serial data communications standard, the initial embodiment of the invention is applied to CANBus which is a serial data bus used in automotive applications.

Figure 5:
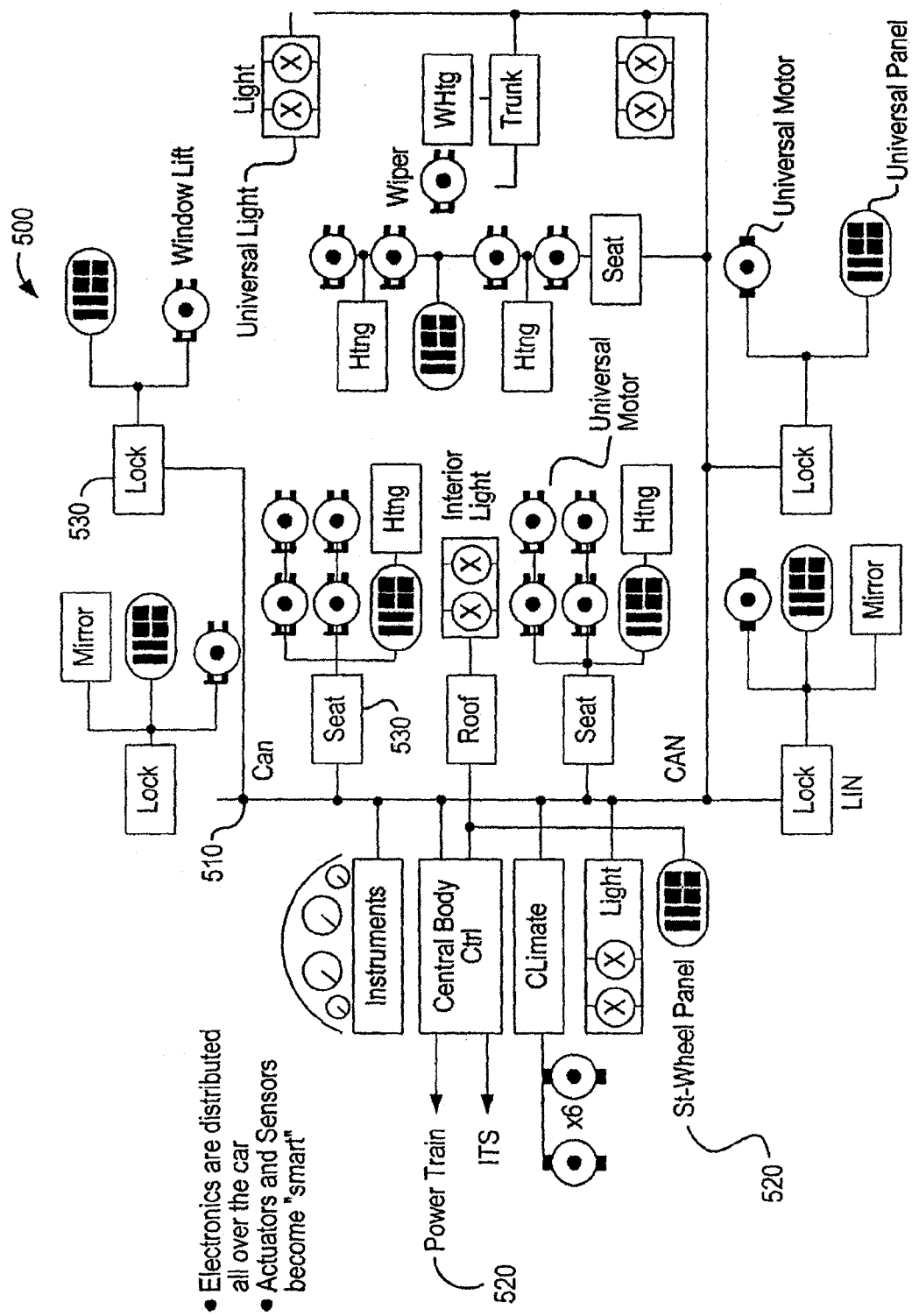
FIG. 5 is a CANBus block diagram for implementation of one embodiment of the present invention.

As a way to reduce costs and weight, improve emissions and efficiency, and meet consumer demand for convenience features, vehicles are becoming more laden with electronics. A typical vehicle electronics system (with CAN and LIN modules) is shown generally at 500 in FIG. 5. The electronics system includes a CANbus 510, various sensors 520 and electronic control units (ECU) 530 for driving the various components and transmitting and receiving various data via bus 510.

With the increase in the complexity of the electronics systems in cars, the process of debugging errors in the system has similarly become more complicated. A debugger must currently use a DSO to verify the functioning of the various system components, and debug "modules", each including an ECU (electronic control unit) 530, and various sensor inputs 520. The complete module comprises a "node" on the electronic bus in the car. The module monitors the sensor inputs and serial data messages that are generated by the various portions of the module, and sends serial data messages generated in accordance with this data onto the bus. These transmitted serial data messages are received, interpreted and used by other modules in the system. More electronic features in the car means more "nodes" on the bus, and the growth of installed nodes tracks with the growth of automotive electronics, about 15%/year.

It is essential for a debugger to measure timing between serial data messages on a signal bus and sensor signals received from various other nodes in the car to verify proper operation. If a particular module is not operating correctly, the debugger may need to investigate the functioning of the various systems in relation to the timing of the transmitted serial data signal. This will in turn require that the electronic test equipment be able to trigger on the serial data signal to understand what is happening before and after the portion of the signal around the trigger. Due to the large number of signals present, a 4-channel DSO would therefore be desirable.

Once a module is installed in a vehicle, unforeseen interactions can occur with other modules or parts in the vehicle. Module suppliers, or their end customer (a car manufacturer) may perform testing after the various modules have been assembled into a vehicle to debug "system" problems. This may require a visit by the module supplier a vehicle lot or other location where an assembled vehicle is available. A vehicle(s) may be driven around until a particular desired error or other signal occurs, at which point the DSO must trigger on the signal, and capture the signal for extensive analysis. System debugging can take a significant amount of time and require a highly skilled debugger.

In accordance with the invention, the CAN analysis subsystem supports four combinable functions:
1) Trigger (on message ID and data).
2) Physical layer analysis (bad bit detection, signal specs verification).
3) CAN protocol decoding functions.
4) CAN symbolic interpretation functions.

System Architecture

Figure 17:
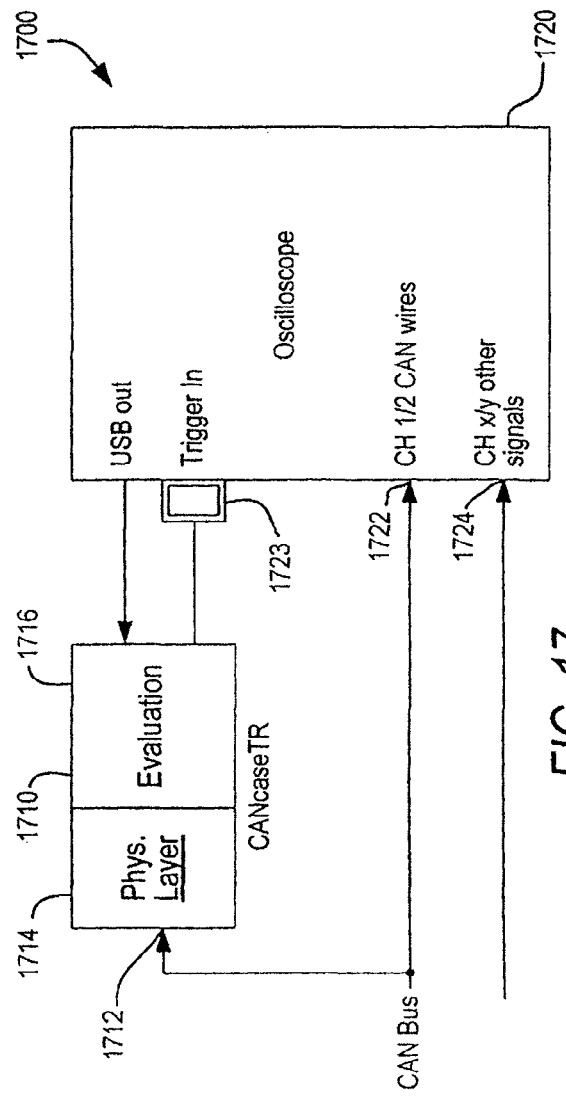
FIG. 17 is a block diagram depicting a CAN ProBus Adapter incorporated into a system in accordance with the invention.

The system in accordance with the CAN bus embodiment of the invention consists of one or more software packages running on either multipurpose or dedicated test measurement equipment. A preferred embodiment would be to run the software on a multi-channel DSO and a dedicated hardware platform including various inputs and underlying computing functions to support the trigger requirements of the system. The hardware package therefore preferably includes a serial hardware trigger. The hardware trigger interfaces with the DSO, and the software packages implement the various user interfaces, drive the trigger module and the various analysis modules. The software and hardware interact in accordance with the invention allowing all common observations in accordance with the CAN protocol from the CAN bus. Such a configuration is shown in FIG. 17. Of course, other appropriate configurations, such as including the trigger hardware and software in a single DSO unit may also be used.

Referring to FIG. 17, the preferred hardware design will now be described. FIG. 17 shows an arrangement of a complete system 1700 constructed in accordance with a preferred embodiment invention when the system is set up for triggering on events occurring on a CAN bus and viewing the corresponding CAN analog signals as well as other signals. A CAN trigger unit 1710 is provided and includes an input port 1712 for receiving CAN bus data. Unit 1710 further comprises a physical layer receiving module 1714 for receiving the CAN analog signal, and an evaluation module 1716 for evaluating the captured message. During evaluation, unit 1710 analyzes the input CAN signal, looking for any of a predefined number of trigger criteria. Upon determination that an event in the CAN data has met one of the one or more predefined trigger criteria, a trigger signal is output from evaluation module 1716 of unit 1710 to an oscilloscope 1720. A CAN ProBus Adapter 1723 feeds the CAN trigger pulse output by CAN trigger unit 1710 into the oscilloscope 1720. As is shown, oscilloscope 1720 may also receive directly the CANbus signals on input ports 1722 and any other signals desired on input channels 1724. The presence of the CAN-ProBus Adapter 1723 identifies which input channel is to be used, and thus which input channel was the source of CAN trigger and allows automation of various related set-ups.

Upon receipt of a trigger from CAN trigger unit 1710, oscilloscope 1720 marks the corresponding portion of the input CAN signal, and preferably annotates the type of trigger condition that resulted in the trigger, if desired. This portion of the CAN signal (if not the entire signal) is then stored for later review by a user.

In addition to viewing the CAN signal, any other signals can be viewed while triggering on CAN, which is one of the benefits of the invention. Some users will not always want to view the CAN signal in a particular case, but rather will trigger on the CAN signal while viewing some other correlated signals of interest to the user. Thus, the user can easily determine the effect of a particular trigger condition occurring on the CAN bus may have on those other correlated signal. In an alternate embodiment, the CAN trigger is input via an external trigger input and four other signals can be viewed, each on one channel of a four channel DSO.

Figure 18:
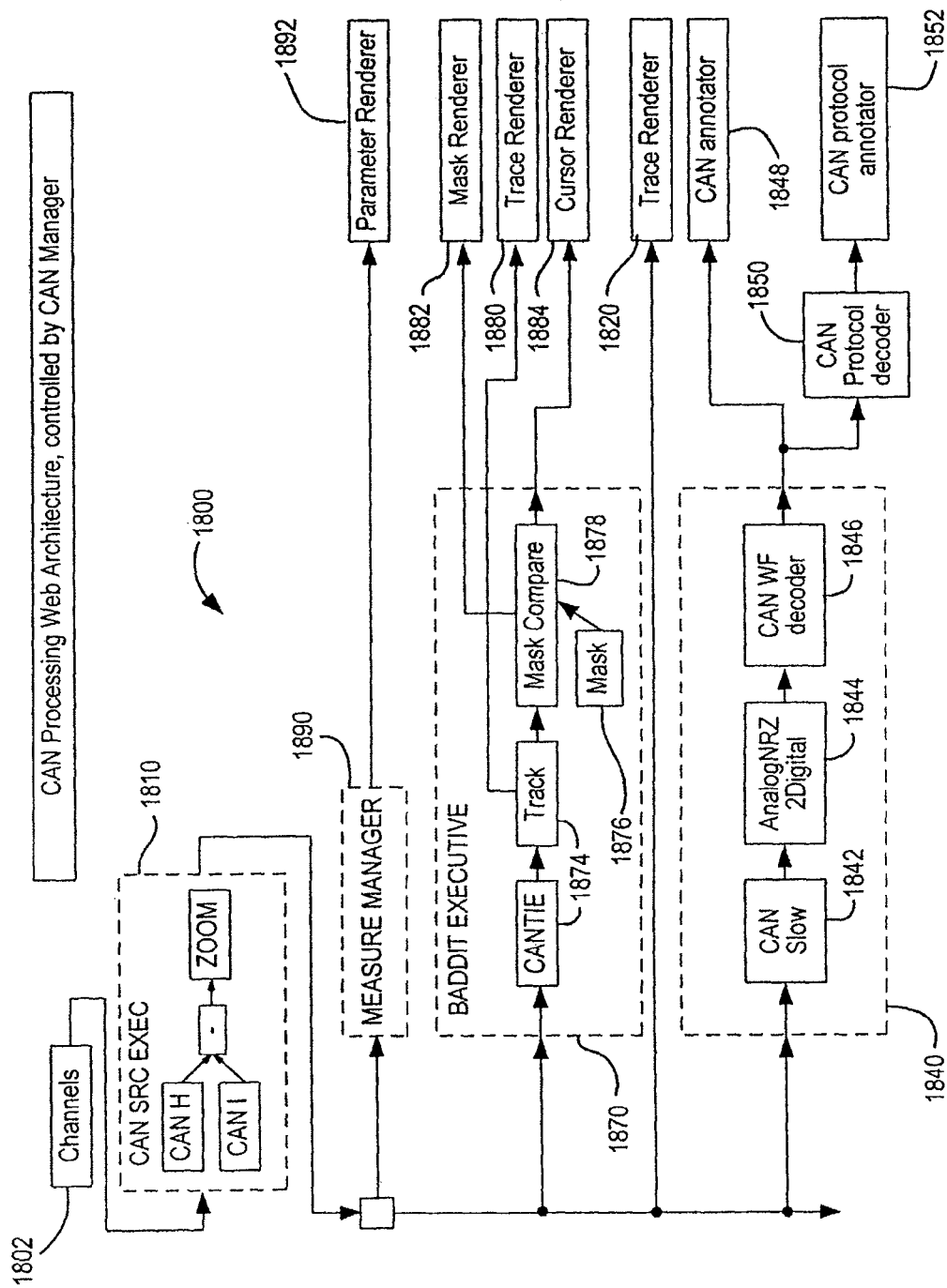
FIG. 18 is a block diagram depicting a CAN processing web architecture in accordance with the invention.

Referring next to FIG. 18, a general software design construction of the system in accordance with a preferred embodiment of the invention will now be described. The CAN Analyser of the invention is implemented by providing a software CAN Manager, indicated generally at 1800, to a manager's collection of control software on a digital sampling oscilloscope (DSO). Three executives (control programs) are included, a CAN SRC executive, a CAN waveform/Protocol Decode executive1840 and a BadBit Locator Executive 1870.

As is shown in FIG. 18, CANBus data is received by one or more channels 1802, corresponding to channels input at input ports 1722 of FIG. 17. CAN SRC Executive 1810 receives the input CANBus data and performs various functional processing of the data to generate a processed data signal in accordance with the received analog data signal. This generated digital data stream is first passed to a Trace Renderer 1820 to be displayed on a screen, along with the other generated display information, as will be described below.

A measure manager 1890 also receives the generated digital data stream from CAN SRC Executive 1810 and controls which measurements are to be computed and displayed. Thus data input thereto is measured in accordance with various desired computations, and the results are displayed by parameter renderer 1892.

A BadBit Executive 1870 receives the data signals from CAN SRC Executive 1810 in response to one or more trigger events. As will now be described, this BadBit Executive 1870 contains the necessary controls for implementing the ability to locate bad bits in a data signal. The input to Bad Bit Executive is the output from the CAN SRC executive1810. In accordance with the invention, the timing of the BadBit Executive 1870 must be time aligned with the CAN trace (output of CAN SRC executive.)

A CAN TIE (Time Interval Error) unit 1872 measures the variation of the standard TIE component that is immune to inter-message gaps. The algorithm utilized by unit 1872 resynchronises to the nominal bit rate at the beginning of each CAN message because the messages are emitted asynchronously onto the CAN bus. The TIEs are then fed into a Track component 1874 in order to view their distribution, time aligned with the source trace. A Mask Compare unit 1878 then compares the calculated TIE to a predetermined mask 1876 to determine if the TIE measurements are out of specification. In order to facilitate viewing, A trace renderer 1880 generates a display of the TIE data received from Track component 1874, the tolerance mask 1876 is displayed by a mask renderer 1882 based upon display information generated by Mask Compare unit 1878, and a cursor is displayed by cursor renderer 1884 based upon cursor information also provided from Mask Compare unit 1878, with violation markers displayed thereon. The tolerance mask width is controlled by a user selection as a percentage of the nominal bit rate. Time interval errors exceeding the predefined tolerance will appear as spikes outside the mask. In a preferred embodiment, on very poor signals, the maximum number of violation markers will be limited to 200 so that a user may still properly interpret the information.

Referring once again to FIG. 18, CAN Waveform Decode Executive 1840 receives the output from CAN SRC executive 1810.

A CAN slicer component 1842 of CAN waveform Decode Executive 1840 decomposes the CAN data stream into packets, one packet for each message. The CAN slicer component implements a PLL to properly recover the clock for the data signal and properly time the phase of the PLL with the start of each data packet. This method of synchronizing an analog signal of a serial data stream may be implemented in accordance with the method and apparatus described in co-pending and commonly-owned U.S. application Ser. No. 10/673,735, filed Sep. 29, 2003, entitled "METHOD AND APPARATUS FOR ANALYZING SERIAL DATA STREAMS", the entire contents of which are incorporated herein by reference. The algorithm employed by the slicer scans the waveform, looking for the packets and any spaces separating them. Then each CAN message segment (or packet) can be submitted to an Analog NRZ to Digital Converter 1844 because the data within the packet is now guaranteed to be NRZ. This component converts the analogue data into a logical bit vector, with associated bit times. The conversion relies on the nominal bit rate, the transition level between 0 and 1 and the sample point within the bit. The user may select all these values, but the defaults are preferably set to 125 Kbits, 50% level, 50% sampling point. A typical frame message including an 11 bit identifier in accordance with invention may 154 bits. An example of the bits and their definitions may be as follows.

| | |
|---|---|
| 1 | Start bit |
| 11 | Identifier bits |
| 1 | SRR bit |
| 1 | IDE bit |
| 18 | Identifier bits |
| 1 | RTR bit |
| 6 | Control bits |

| | |
|---|---|
| 64 | Data bits |
| 15 | CRC bits |
| 23 | (maximum) Stuff bits |
| 1 | CRC delimiter |
| 1 | ACK slot |
| 1 | ACK delimiter |
| 7 | EOF bits |
| 3 | IFS (Inter Frame Space) bits |
| 154 | bits |

A CAN decoder 1846 receives all of the packets digitized by the Analog NRZ to Digital Converter 1844, each containing a raw bit vector with associated bit times, and processes them, one message at a time. The CAN decoder 1846 primarily extracts the ID and data information, but it also verifies the coherency of the message (stuff error, CRC errors, DLC incoherent with data length, form error, no acknowledgement). At this stage, there is no longer any analogue information in the processed data signal. The algorithm in CAN decoder 1846 starts by removing the stuff bits inserted by the CAN chip when the signal was emitted. The algorithm then computes the CRC on the message. Then the message is determined to include an 11 bit ID or 29 bit ID. The ID is then extracted, as well as the DLC, the data bytes and the CRC. The extracted CRC is compared against the computed CRC. All of this information, as well as the possible errors are wrapped into a structure containing the raw bit vector, the raw bit times and the decoded message, further including the packet type, the packet ID, the number of data bytes, the actual data, the checksum data, and the state of the acknowledge field.

Finally a CAN annotator 1848 uses the information contained in the structures described above to annotate the waveform displayed on screen, according to the user selected viewing criteria. The annotator uses the basic primitives to annotate by providing information for cursors and labels. The annotation elements are positioned onto the trace by using the bit time array, converted into pixel positions. The following table 1 governs the preferable colors (of course other types of designations are possible).

TABLE 1

| Information unit | Color of region |
|---|---|
| Native trace color | De-emphasis |
| Stuff bits | Grey |
| ID bits | Orange |
| DLC | Green |
| Data bits | Light blue |
| CRC | Blue |
| Errors | Red |
| All other bits | Native trace color |

In accordance with the invention, once the digital information has been decoded into hexID information by CAN Waveform Decoder 1846, a Protocol Decode Executive 1850 may be employed to further interpret the decoded information, to convert it from a hex format into various more easily understood symbols in accordance with definitions in the applied encoding protocol. The Protocol Decode Executive 1850 allows the selection of a database corresponding to the protocol of the decoded data needed for the analog signal received. The Protocol Decoder receives the output of the CAN Waveform Decoder 1846, and transforms the hex ID into a symbol. When the protocol database is in use, two noticeable things happen: the trigger can be set using symbols and the decoding shows symbols. The interpreted data is then forwarded to a CAN protocol renderer 1852 to be displayed in the screen with the other displayed information.

The user is able to control the compound processing chain from a single point in the system. Some of the controls that are accessible to the user act upon the source choice for input data, some upon the bit extractor (level and sample point) that allow the user to customize the analysis performed by the system, some upon the viewing characteristics of the signal (View group). These features will now be described in greater detail.

CAN Manager 1800 offers a set of dialogs to a user, from which various CAN analysis actions of the invention can be controlled. These dialogs will be described below. Because of the modularity of the software functions, these dialogs may be updated and supplemented as desired, either by addition of the functionality, or by the user voluntarily choosing a different software package for implementation.

In accordance with the invention, the CAN software subsystem is implemented via a Graphical User Interface (GUI) on a dedicated hardware platform, of running on a pre-existing DSO. The GUI includes a number of dialogs for defining and performing various analysis functions in accordance with the invention.

Figure 6:
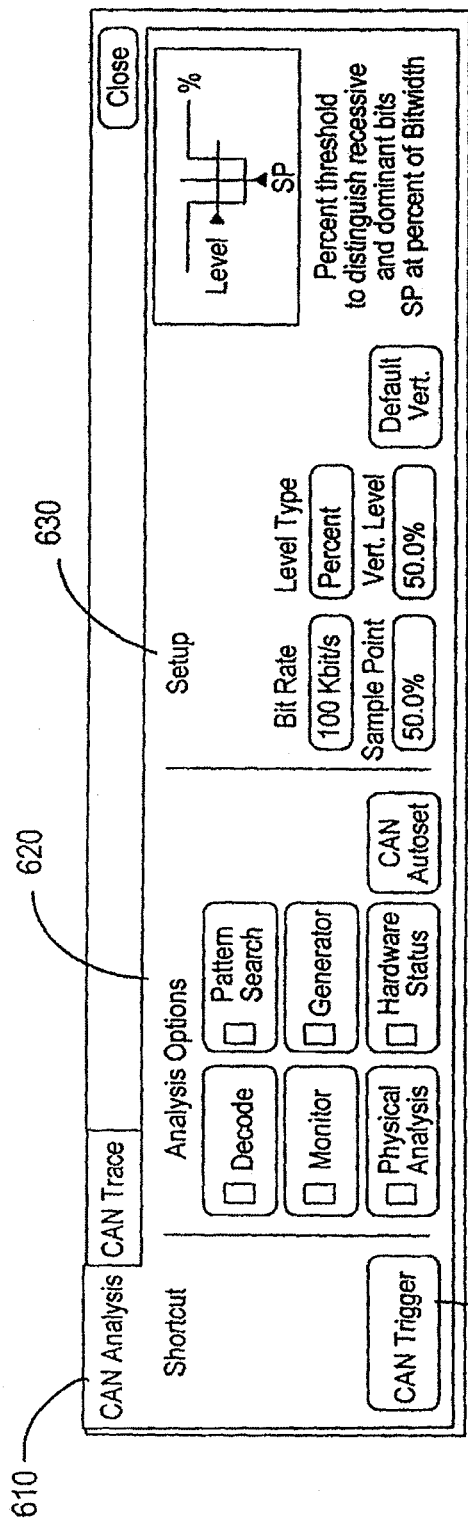
FIG. 6 is a screen shot depicting a CAN Analysis dialog box allowing a user to setup parameters about the signal, such as Bit Rate and Sample point in accordance with the invention.

An example of a first of these dialogs is shown in FIG. 6. Upon implementation of a CAN Analysis routine as selected by a user, in accordance with an embodiment of the invention, a CAN Analysis dialog is opened (see FIG. 6). Initially the dialog shows 2 tabs allowing for selection between them by a user, CAN analysis tab 610 and CAN Trace tab 710. (As the various dialogs are selected, more tabs will appear, including the following: Source Selection, The Physical Layer Analysis, Waveform Decode, Protocol Decode and Pattern search).

Upon selection of CAN analysis tab 610, a user is presented with a number of selections to define the analysis that is to be performed on an acquired waveform. Thus, a user is presented with a number of analysis options 620 (including Decode, Monitor, Physical Analysis, Pattern Search, Generator, and is also provided with analysis setup options 630 which allows for setting various bit rates, threshold levels for distinguishing between bits, and the like. A CAN trigger, may also be accessed via a short cut button 640 on CAN analysis tab 610.

Figure 7:
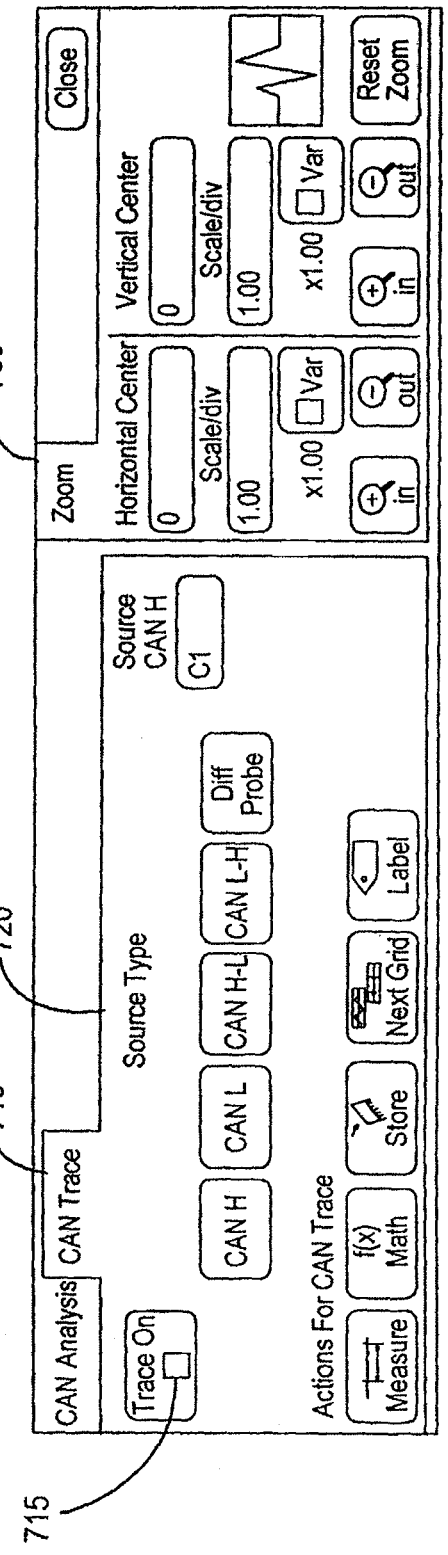
FIG. 7 is a screen shot depicting a CAN Trace dialog box allowing a user to select between various types of input signals in accordance with the invention.

Upon selection of a CAN trace tab 710, a user is presented with a plurality of selections for setting the various display and interpretation functions for the incoming CAN data signal. Thus, a user may turn the display of the trace function on by selecting the radio button 715, and select the source that is being analyzed by the system at source type selection 720 (such as an H signal, L signal, or the difference between these signals). The user is also invited to define various parameters for the display of the CAN trace on a screen at zoom section 730. Typically the functions described with respect to FIGS. 6 and 7 would be set up before signal acquisition, but of course these menus could be accessed at any time to modify the various settings.

While using the analysis system in accordance with the invention, it is contemplated that the user regularly switches between the CAN trigger menu, the various Waveform Decode dialog tabs and the regular functions of the DSO, as will be described below. The user would normally set-up the CAN trigger conditions for the events that are to be captured. Then, either before or after the waveform is captured, the user would setup the waveform decoding features of the invention to observe message content and other predefined conditions of the waveform, before and after a defined trigger point.

Figure 13:
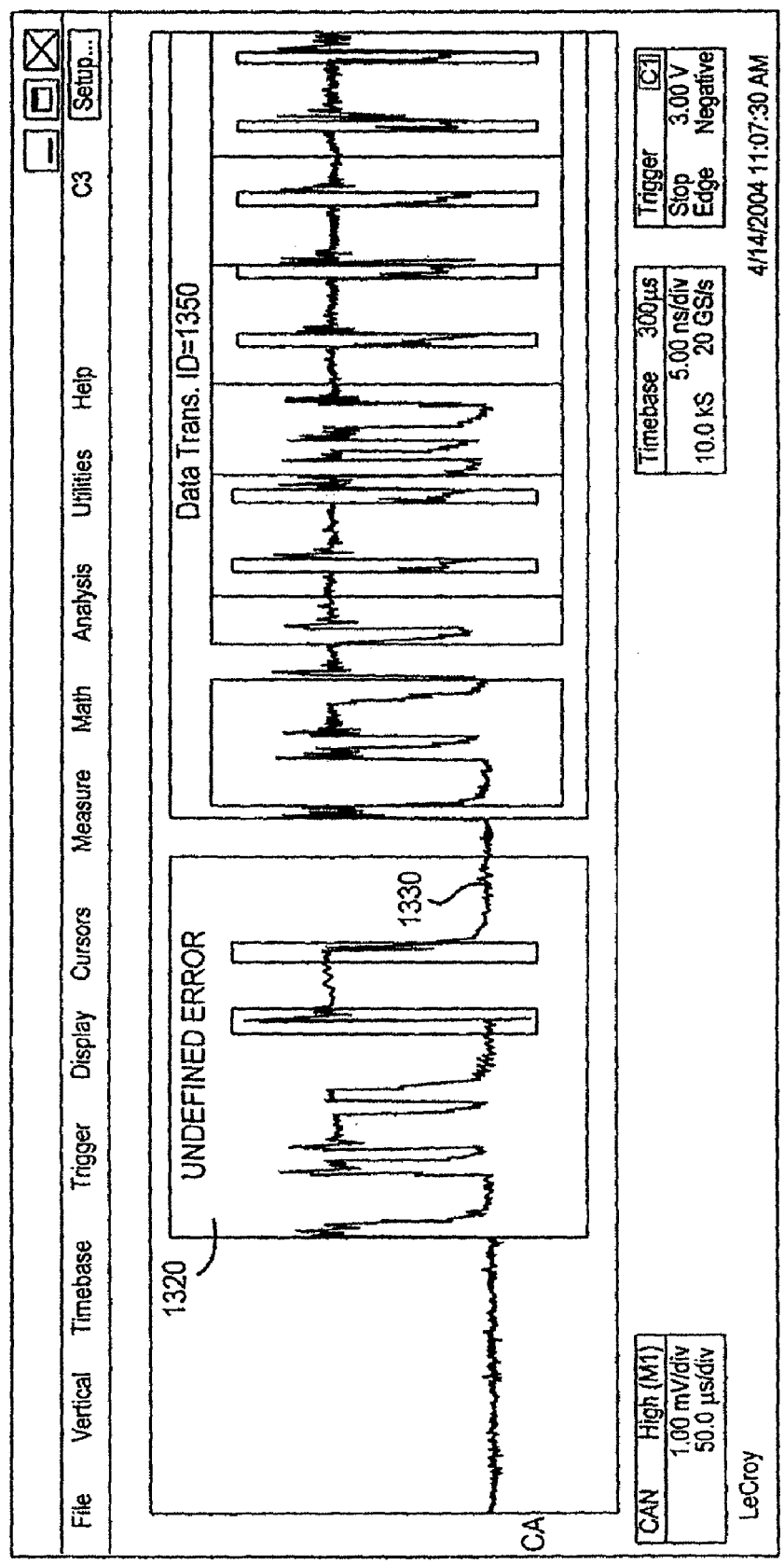
FIG. 13 is a screen shot depicting the details of a single message including an error when the decoded signal is unrecognizable.

Users may be using the analysis system of the invention to look for pathology in a message content caused by distorted, noisy and/or misaligned signals. Thus, the system would be set up to trigger on various error conditions, or other predefined signal irregularities. In accordance with the invention, subsequent review of the waveform corresponding to an error in the decoded information is easily implemented, because when a waveform labeling function is activated, messages interpreted from the decoded data in the waveform are labeled and "hooked" to the waveform. All types of messages defined in the CAN specs are identified (Data, Remote, Error and Overload). Each time a message is interpreted, the message is hooked to the waveform (as noted above) so that upon review of the waveform, a user can view all of the interpreted messages, along with the digital data and underlying received waveform associated with the interpreted message. When a message is beyond recognition (bad bit definition, undershoot, spikes, incorrect stuff bits) for the CAN decoder because the analog waveform is too distorted and/or corrupted, an icon indicating that the message was not recognized as one of the predefined messages will be used, as is shown in FIG. 13. FIG. 13 depicts a display 1300 including a data signal 1310, and a portion 1320 of signal 1310 which when decoded from the analog data signal in accordance with the applicable protocol, generates an unrecognized bit sequence. Thus, the display attaches a label "UNDEFINED ERROR" to indicate that the bit sequence is not recognized. Thus, a trigger request can be defined in accordance with a particular data sequence in the digital data, or can be defined to trigger on an unrecognizable data sequence.

Figure 8:
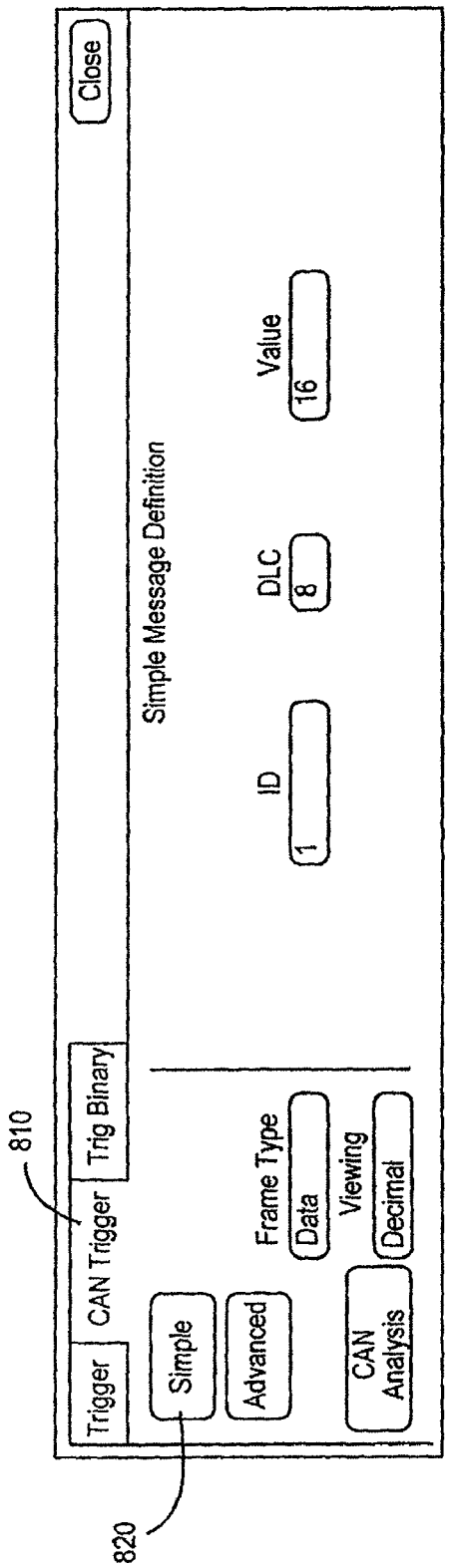
FIG. 8 depicts a particular implementation of the CAN Trigger of FIG. 6 in accordance with the invention.

From the CAN Analysis tab 610 a user may select a can trigger button 640, which will bring the user to a CAN trigger module UI dialog, as shown in FIG. 8.

The CAN trigger tab 810 allows a user to access the CAN trigger setup, allowing for simple or advanced features to be selected. If a user selects the simple button 820, the user can set the trigger to operate by finding a single CAN message, preferably by a message ID. The CANProBus Adapter will automatically detect on which DSO channel the CAN trigger is input. The trigger condition may be only on the CAN ID, only on the data, or any combination of both.

Figure 9:
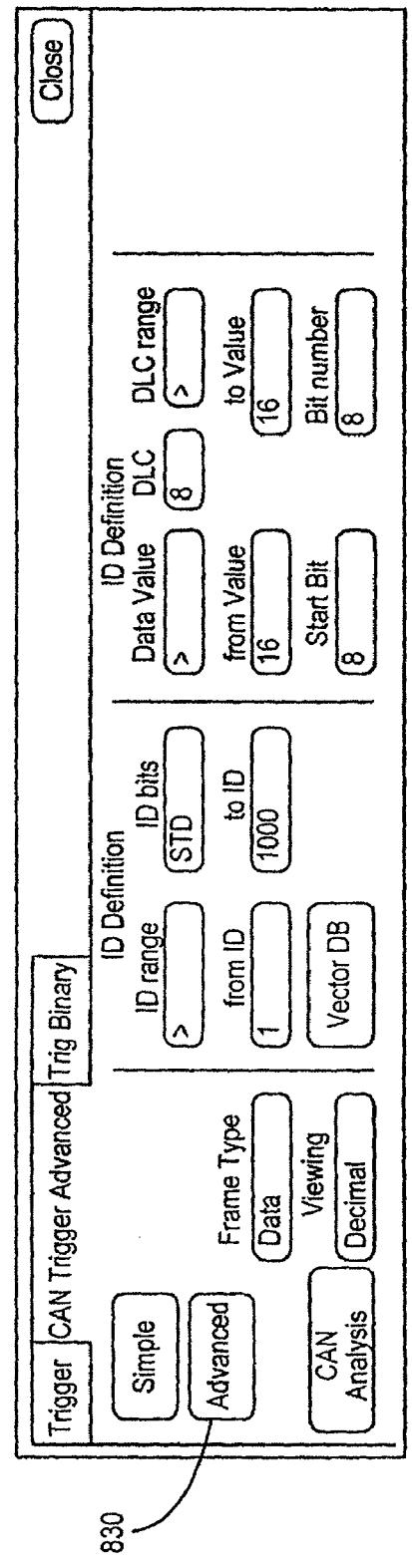
FIG. 9 depicts a particular implementation of the CAN Trigger of FIG. 6 in accordance with the invention.

Alternately, when the advanced capability is present and selected at button 830 (see FIG. 9), the user can set the trigger using symbolic names, or combinatorial logic on various ID, data and other fields present in the message. The symbolic info translates the message ID into text like VEHICLE_SPEED, and the data into physical values i.e 12 m/s so that the user can employ more user-friendly terms in order to define the events to be reviewed. In accordance with the invention, a user is able to visualize the content of the CAN signal, with different levels of detail, in a format that is appropriate for the user in a particular application. For example, the output may be displayed in hexadecimal, ASCII, or the like. The precise methods for defining the various display and selection parameters will be discussed below.

Figure 10:
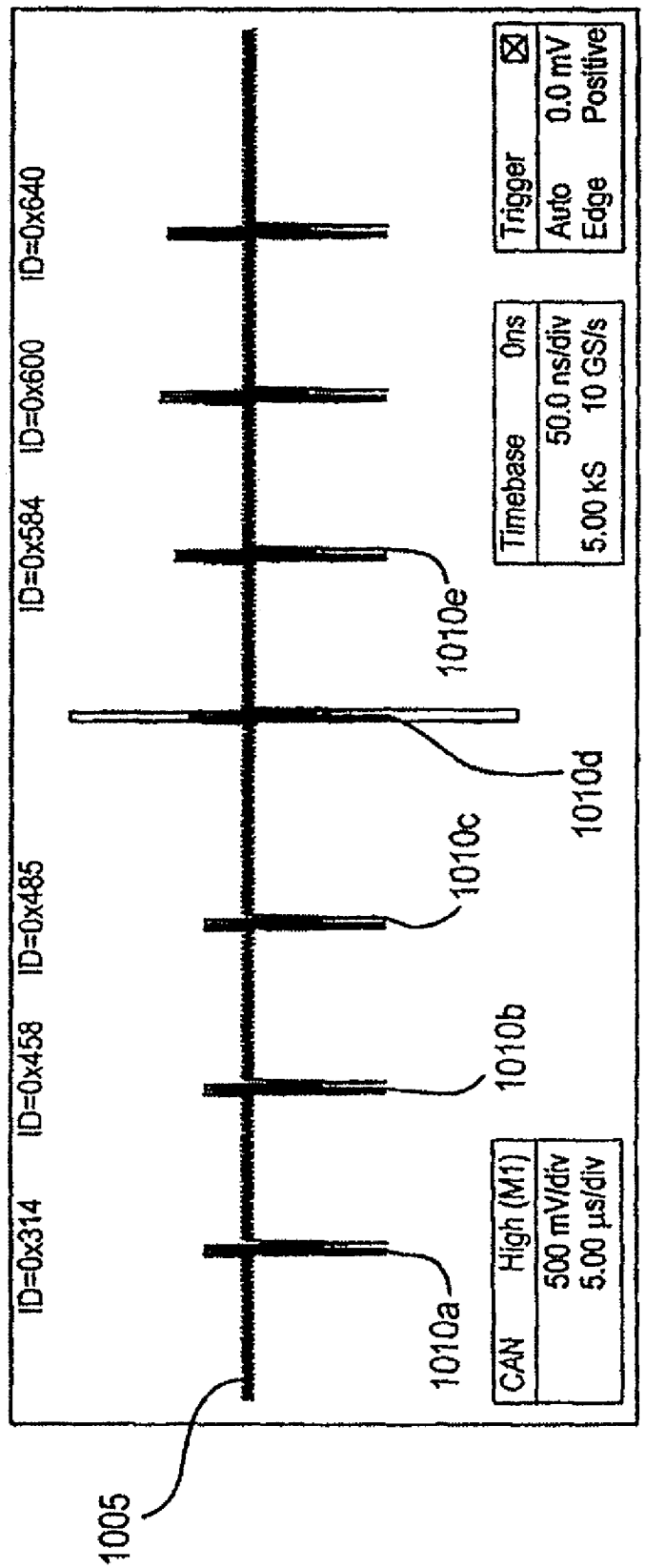
FIG. 10 is a screen shot depicting multiple messages that have been captured, one having an error, in accordance with the invention.

As is shown in FIG. 10, when displaying many CAN messages 1010a-1010g within one screen, an overview of the CAN stream 1005 is first displayed. Each message includes the message ID above the packet including the message when the packet is healthy. An error designation, and preferably, a recognizable icon, flags one or more sick messages (see 1010d for example). When zooming on those flagged messages, a user is able to see the underlying analog data signal that is the cause of the incoherent message. Various labels, indicating various interpreted messages, portions of the signal, etc. are attached to the first edge of a corresponding packet and float along with the packet when the gain or offset for viewing the signal is changed.

The regular time cursors (grid) shown in FIG. 10 can also be used to measure absolute time and time intervals between events of interest. The events of interest can be on different waveforms. For example, if the time delay between a temperature sensor change and its broadcast on the CAN bus is desired to be reviewed, the reference cursor may be positioned on the temperature sensor read out, and the difference cursor on the corresponding CAN message identified by its ID. If the delay between a query to a CAN node and its reply is desired, the cursors can be positioned on the remote and data frame, both on the analog CAN signal.

Figure 11:
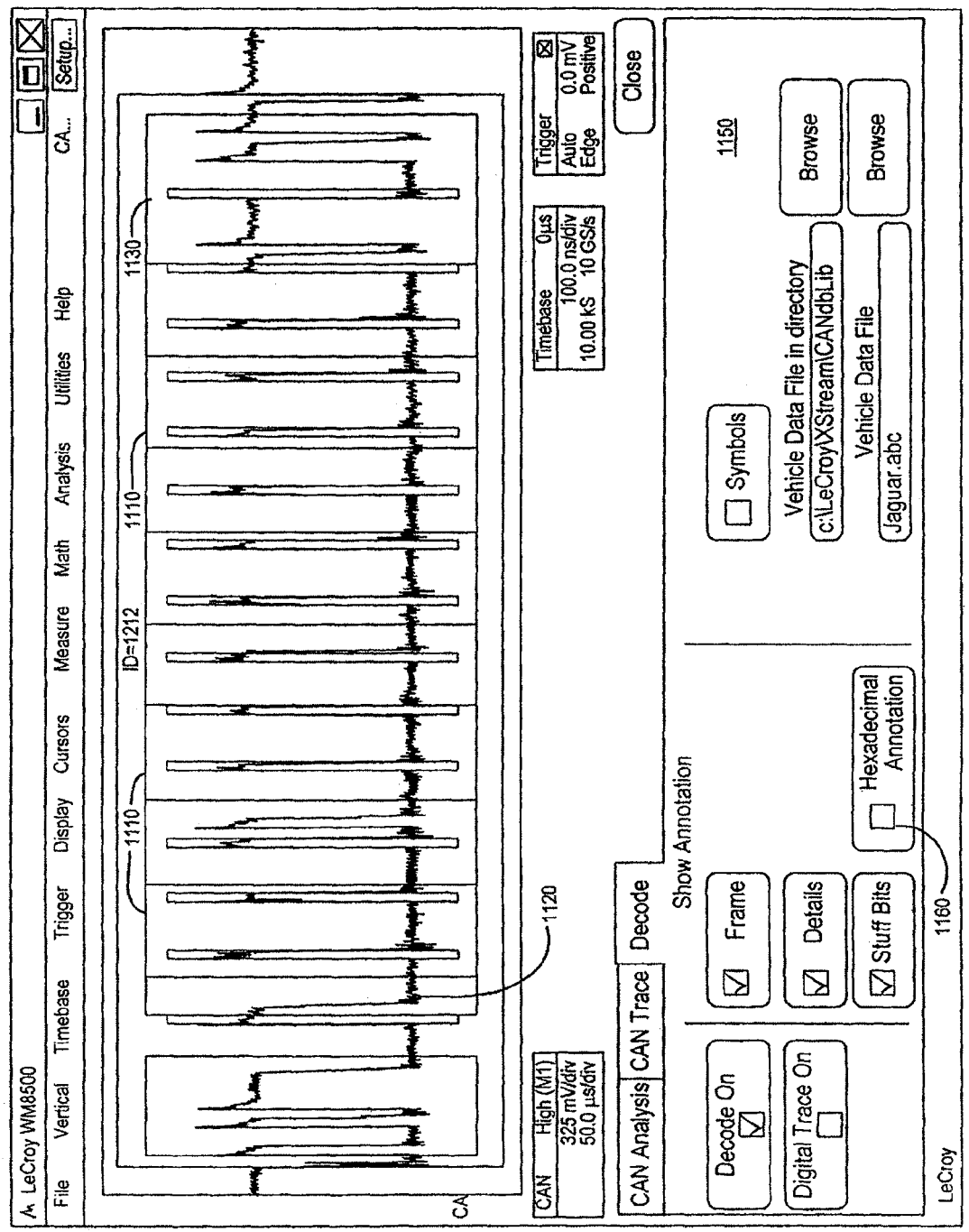
FIG. 11 is a screen shot depicting the details of a single message including stuff bits with decoded data shown in decimal in accordance with the invention.
Figure 12:
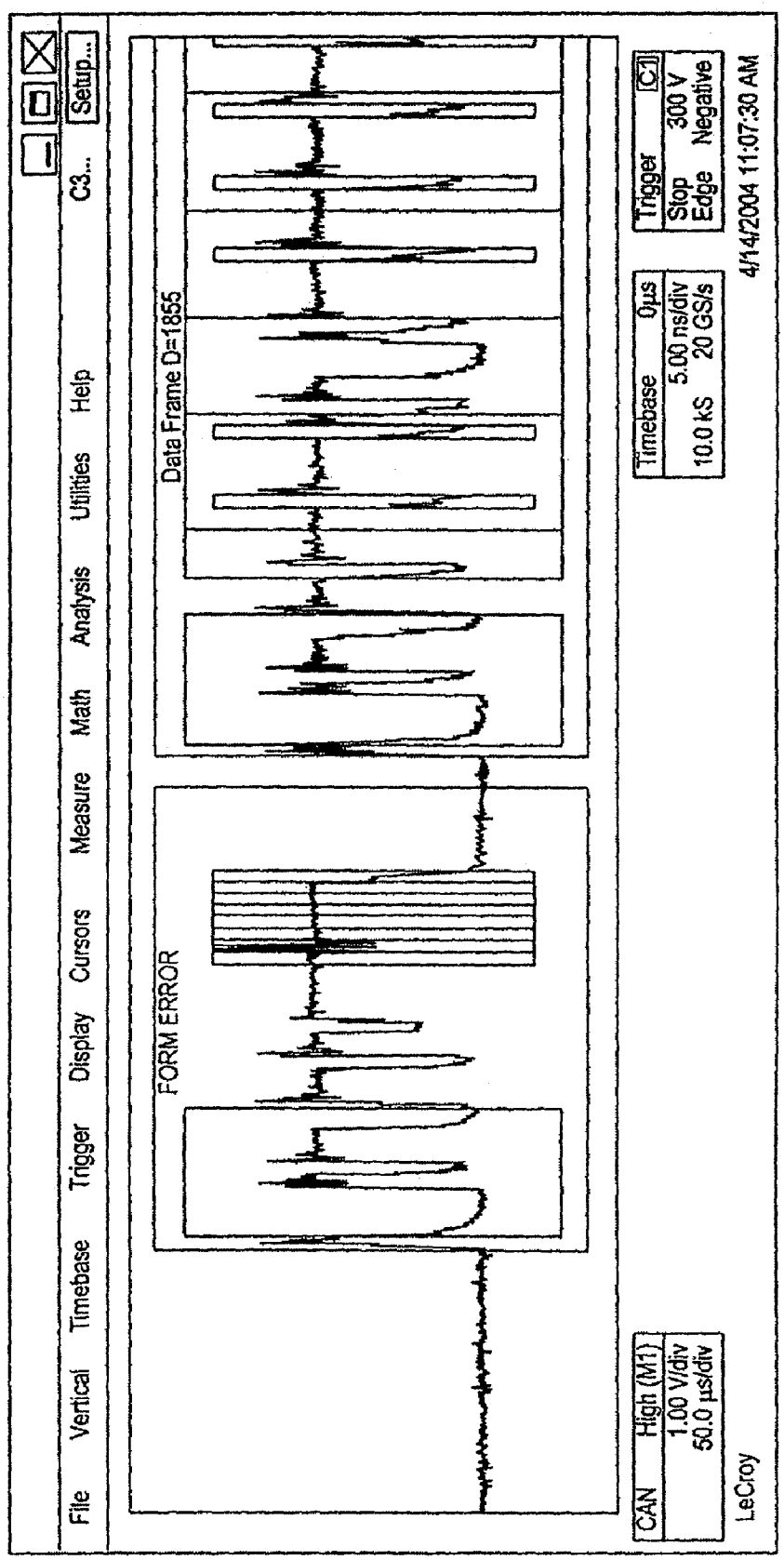
FIG. 12 is a screen shot depicting the details of an error frame decoded in hexadecimal, with stuff bits not included, in accordance with the invention.

When zooming onto a decoded CAN waveform, more details of the particular waveform will be shown. FIG. 11 shows a zooming in on message containing annotated fields main fields 1110. Stuff bits 1120 and CRC checksum bits 1130 are delineated in some desired manner, such as by making them a different color, or the like. FIG. 12 depicts zooming in on a particular error message, such as 1010d of FIG. 10 FIG. 12 includes similar fields as those shown in FIG. 11.

The annotation behavior described above is governed by the concept of annotation density. The annotation density represents the total number of annotations displayed on the signal (text, icons, arrows, and color-coded sections) per screen. At any given zoom factor and taking into account the user selectable viewing items, the annotation density should not exceed a certain predefined threshold limit. In order to present a display with a reasonable amount of information, the total volume of annotation at any given zoom factor should be limited. The determination of which annotations to remove when necessary (i.e., when a display is zoomed out) is generally governed by the importance of each of the annotations. For example, when showing 500 CAN messages on screen, only a colored strip may appear. It would be impractical to show every message's ID. Therefore only error messages, which are the most important to the user when taking a wide overview of the bus, should be displayed.

In FIG. 6 at CAN Analysis tab 610, if a user selects the decode analysis option from the analysis options 620, a CAN Waveform Decode UI dialog is opened, as is shown generally at 1150 in FIG. 11. This dialog implements the Waveform Decode Executive 1840 of FIG. 18. As is shown in FIG. 11, the user can select various portions of the decoded waveform to be displayed. By selecting one or more radio buttons from show annotation section 1160, the user can display stuff bits, ID information, decoded data, CRC data and acknowledgement data.

During signal acquisition, it may be desirable to determine the integrity of the acquired data signal. In accordance with the invention, the user is presented with a CAN Physical Layer Bad Bits Locator, and Associated Measurement Tools UI dialog, as will be described below.

This dialog module comprises a physical layer verification module and is made up of two parts, a Bad Bit locator (implementing the BadBit Executive 1870 of FIG. 18) and a general signal measurement tool Implementing Measure Manager 1890 of FIG. 18. Both tools may be turned on from main CAN tab 610, using the tick boxes in the analysis options section of the dialog. When accessing the various measurement tools, when this view is selected, the CAN manager automatically turns on various measurements that enable a user to measure the various signal amplitudes, time variations between bits within a packet, and timing variations between various packets.

When utilizing the BadBit Locator, the CAN manager automatically sets up the processing chain needed to identify bad bits, one of the biggest worries of hardware engineers working on CAN. A dedicated Bad Bit tab allows the setting of a few parameters as is further desired. Both physical layer analysis tools operate on the source data stream selected in FIG. 7. The raw data (CANH and CANL) can optionally be displayed by ticking the "Trace On" selection 715 of FIG. 7.

Figure 14:
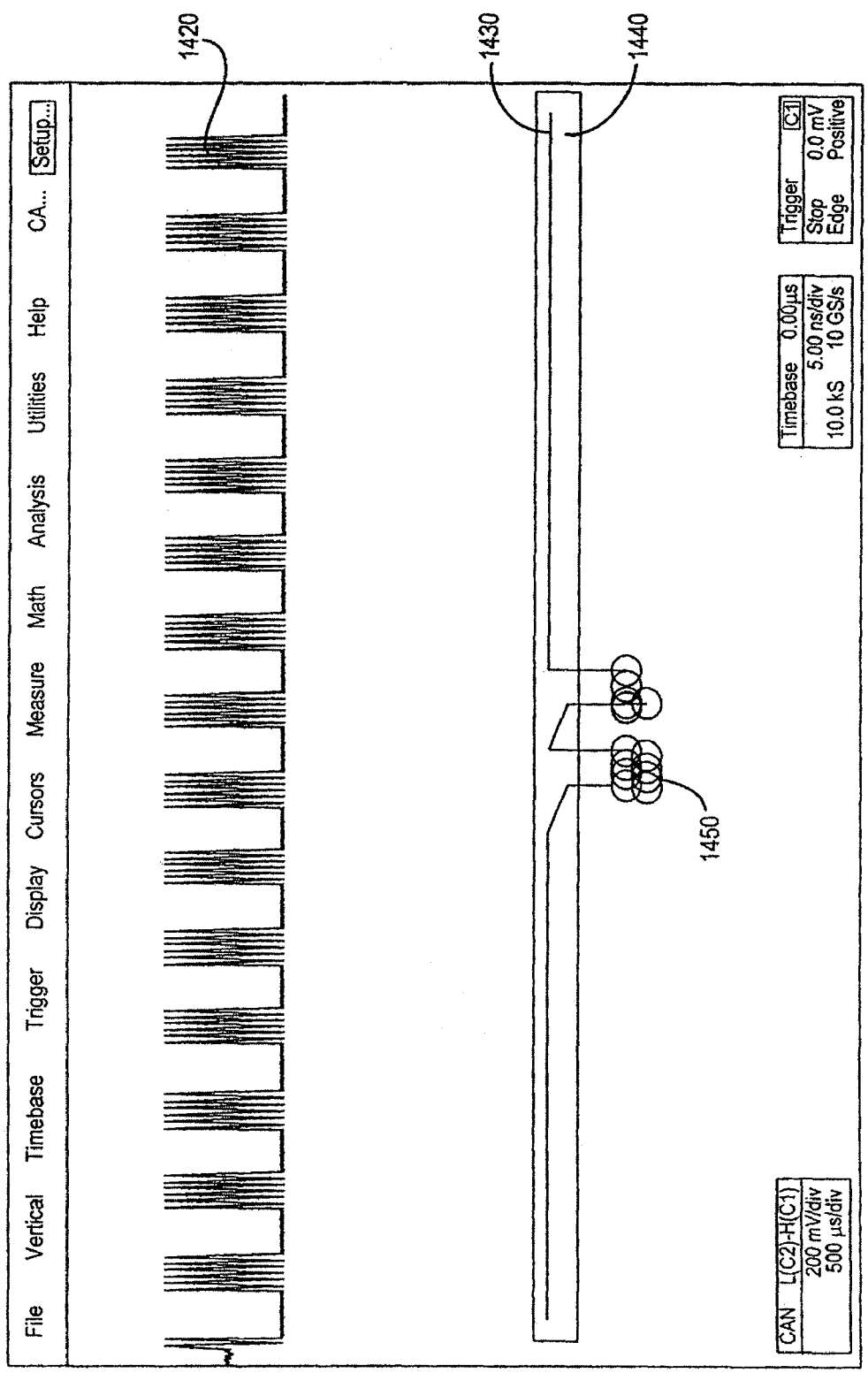
FIG. 14 is a screen shot depicting the implementation of a bad bit locator function in accordance with the invention.

Referring next to FIG. 14, a screen shot depicting the results of use of the Bad Bits Locator tool is shown. The BadBits Locator shows, on a display 1410, a CAN trace 1420 (designated the CAN signal), and a BadBit trace 1430, both being drawn by trace rendered 1880 of FIG. 18. The BadBit trace is indicative of the time interval error of the various bits of CAN trace 1420. Both traces are time aligned. A bad bit in CAN is a bit whose observed width is not within a user specified tolerance of the nominal bit width of a standard bit on the CAN bus. This bad bit appears in the BadBit trace 1430 as a spike outside the normal value of the trace. The bad bit in CAN trace 1420 is time aligned with the spike on BadBit trace 1430 so it is easy to pinpoint the portion of the CAN trace generating the bad bit, and to zoom onto the CAN trace to more closely examine the portion generating the bad bit reading.

A mask 1440 (implementing mask 1876, mask compare 1878, and mask renderer 1882 of FIG. 18) around BadBit trace 1430 assists in locating the bad bits, with circles 1450 showing actual mask violations. The vertical mask tolerance (vertical width of the mask, and deviation of the mask from a center, average value) reflects the user's expressed tolerance for bad bits on his CAN signal. For example, when working on a 100 kbit/second CAN line, the bit width is 10 μs. If the user specifies a 10% tolerance on the bit timing, the mask width has to be set to 10% of 10 μs, therefore 1 μs. When zooming into the waveform, the user can observe the bad bits in more details, while retaining the Bad Bit Locator time aligned with the CAN trace. The zoom function maintains the CAN trace and the BadBit trace time aligned.

Figure 15:
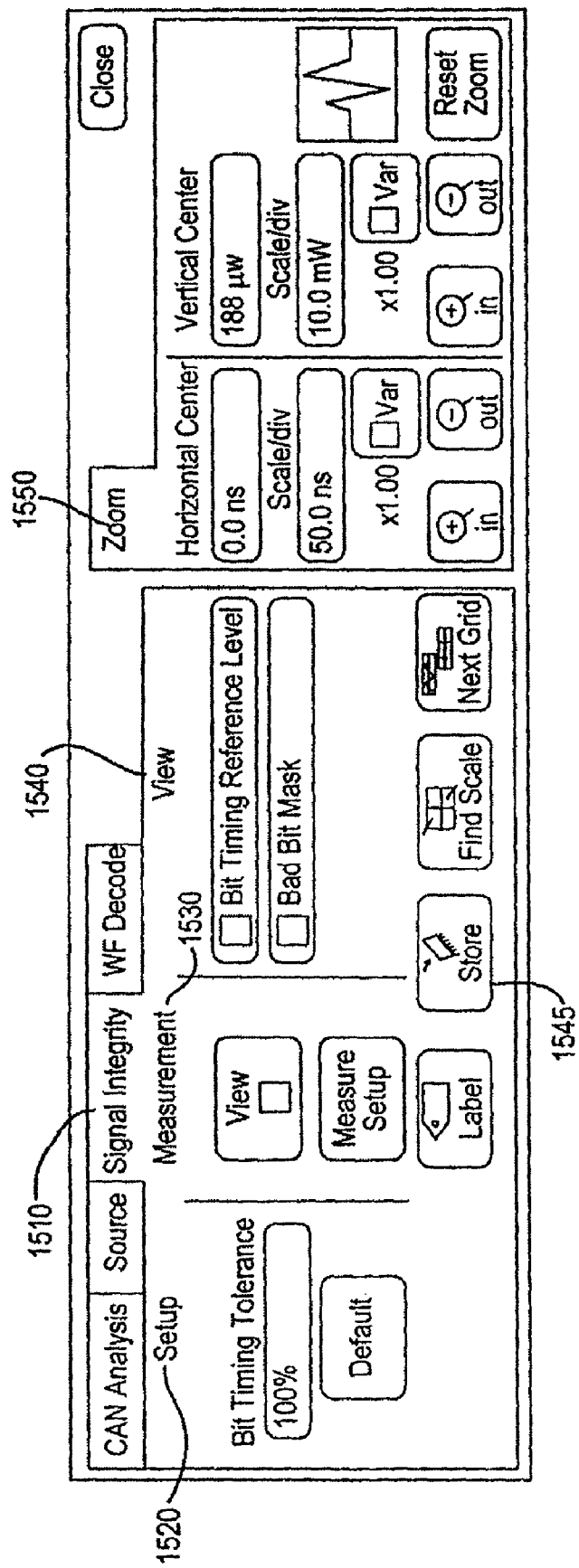
FIG. 15 is a screen shot depicting a Signal Integrity dialog box for setting various parameters for testing the integrity of a data signal in accordance with the invention.

These parameters, such as bad bit tolerance and zoom are set using a dialog box depicted in FIG. 15. As is shown, by selecting a signal integrity tab 1510, a user can access the setup menu 1520 to set the bit timing tolerance, the measurements menu 1530 to select the measurement setup sub-menu to make various measurements on the waveform, and the view menu 1540 to define whether the timing reference level and/or the bit mask should be shown on the display. The user may also select from a number of buttons for storing data and menu selections, automatically selecting a scale of the display, and the like. Also shown in FIG. 15, the user may select the zoom tab 1550 to implement various zoom features on the display of the traces to allow for a more detailed view thereof, as discussed above.

Figure 16:
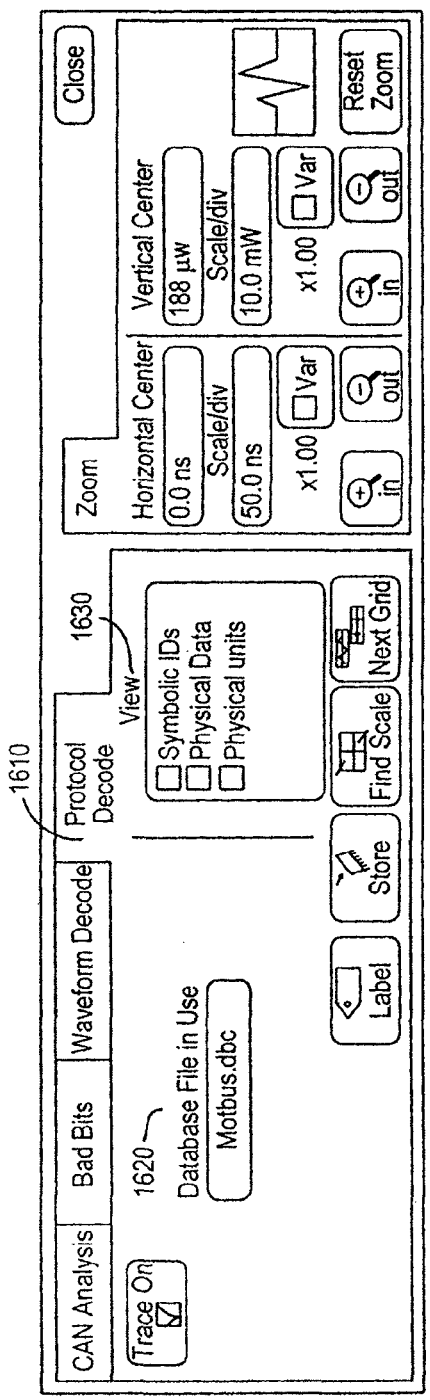
FIG. 16 is a screen shot depicting a protocol decode dialog box for setting parameters in accordance with the protocol format of a received signal in accordance with the invention.

In addition to decoding the acquired analog signal into digital representations thereof, as noted above, the user can request that the decoded data be interpreted into various CAN messages, thus implementing the CAN protocol decoder 1850 of FIG. 18. In accordance with the invention, the CAN Protocol Decode module allows performance of this function, as is shown in FIG. 16. Therefore, as noted with respect to FIG. 18, this module goes one step further than the Waveform Decode module by interpreting and showing the symbolic CAN messages instead of the decoded hexadecimal values. For example, instead of showing "ID=0x123, data byte 2=0x78" the display may read "VEHICLE_SPEED=1.2 m/s". As is shown in FIG. 16, upon selection of a protocol decode tab 1610 the user is first able to indicate the protocol file 1620 that is to be used in interpreting the decoded digital data. Additionally, at section 1630 the user is able to request some choices to govern the symbolic annotation level and thus define what is shown in the display, including symbolic IDs, Physical data and Physical units, and the density of the annotation on various zoomed traces.

Therefore, in accordance with the invention, a user is able to capture an analog waveform representative of a digital information signal, and decode the analog waveform to generate digital data. Any errors in the digital data (or analog data, if desired) will generate a trigger in the detector, thus associating the digital data with the error to a particular portion of the underlying information signal. The user is then able to view the portion of the analog signal that generated the digital error. In the use of a CANBus system, the invention allows for a user to monitor CANBus messages, and upon the occurrence of a particular predetermined event, view wither the data on the CANBus, or the reaction of other parameters to the situation that generated the trigger condition. Thus, a complex analysis that conventionally required a great number of calculations by a user can be performed relatively simply and efficiently.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for displaying an analog waveform and a plurality of corresponding protocol decoded values, comprising the steps of:
   inputting the analog waveform
   displaying on a display a portion of the analog waveform;
   selecting a zoom factor at which the portion of the analog waveform is displayed;
   delineating a plurality of time segments of the displayed portion of the analog waveform by decoding said analog waveform in accordance with a predetermined protocol; and
   displaying on said display the protocol decoded values corresponding to each of the delineated time segments of the displayed analog waveform adjacent the respective corresponding delineated time segment, the amount of the protocol decoded values that are displayed being determined at least in part in accordance with the zoom factor selected to display said portion of the analog waveform.

2. The method of claim 1, wherein each delineated time segment is delineated by employing a translucent shape overlaid on the displayed portion of the analog waveform.

3. The method of claim 2, wherein a different translucent shape is utilized to designate different time segments of the displayed portion of the analog waveform.

4. The method of claim 3, wherein the protocol decoded value corresponding to each of the delineated plurality of time segments is displayed within the respective corresponding translucent shape.

5. The method of claim 3, wherein the protocol decoded value corresponding to each of the delineated portions is displayed above the respective corresponding delineated time segment of the displayed portion of the analog waveform.

6. The method of claim 4, wherein the protocol decoded values comprise protocol decoded values of respective delineated time segments of the displayed portion of the analog waveform.

7. The method of claim 6, wherein each of the protocol decoded values corresponds to one or more portions of a protocol decoded message.

8. The method of claim 6, wherein the protocol decoded values comprise bit error rates associated with the delineated time segments of the displayed portion of the analog waveform.

9. The method of claim 1, further comprising the step of delimiting a larger portion of the analog waveform, said larger portion including one or more of the delineated time segments.

10. The method of claim 9, wherein said larger portion of the analog waveform is delineated by overlaying a translucent shape on the displayed portion of the analog waveform.

11. The method of claim 1, wherein upon displaying a smaller amount of the analog waveform, more of said protocol decoded values are displayed.

12. The method of claim 1, wherein each said time segment is delineated by overlaying a colored translucent shape on the displayed portion of the analog waveform.

13. The method of claim 1, wherein each said time segment is delineated by overlaying a shape on the displayed portion of the analog waveform.

* * * * *